US012730950B1

(12) United States Patent
Sutherland et al.

(10) Patent No.: US 12,730,950 B1
(45) Date of Patent: Sep. 8, 2026

(54) POWER SHUT-OFF IN HIGH-LEVEL SYNTHESIS FLOW

(71) Applicant: Cadence Design Systems, Inc., San Jose, CA (US)

(72) Inventors: Stephen B. Sutherland, Redmond, WA (US); Felice Balarin, Berkeley, CA (US); Sean Dart, Sammamish, WA (US); Michael Scott Meredith, Edmonds, WA (US); Mark A. Jensen, Pittsburgh, PA (US); Jeffrey Mark Marshall, Raleigh, NC (US)

(73) Assignee: Cadence Design Systems, Inc., San Jose, CA (US)

( * ) Notice: Subject to any disclaimer, the term of this patent is extended or adjusted under 35 U.S.C. 154(b) by 767 days.

(21) Appl. No.: 18/130,101

(22) Filed: Apr. 3, 2023

(51) Int. Cl.
*G06F 30/327* (2020.01)
*G06F 30/33* (2020.01)

(52) U.S. Cl.
CPC ............ *G06F 30/327* (2020.01); *G06F 30/33* (2020.01)

(58) Field of Classification Search
USPC .......................................................... 716/100
See application file for complete search history.

(56) References Cited

U.S. PATENT DOCUMENTS

2009/0222772 A1* 9/2009 Charlebois ............ G06F 30/327 716/133
2019/0004809 A1* 1/2019 Hoshi .................. G06F 30/327
2020/0104458 A1* 4/2020 Chuang ................. G06F 30/327

* cited by examiner

*Primary Examiner* — Mohammed Alam
(74) *Attorney, Agent, or Firm* — Schwegman Lundberg & Woessner, P.A.

(57) ABSTRACT

Methods and systems are provided for performing power shut-off in a high-level synthesis flow. The methods and systems access a high level synthesis flow (HLS) file representing a circuit design. The methods and systems process the HLS file to identify a portion of the circuit design that is associated with power shut-off indicating that the portion of the circuit design is enabled for shut down. The methods and systems, based on identifying the portion of the circuit design that is associated with power shut-off, synthesize the HLS file into a register-transfer level (RTL) design of the circuit design in which one or more logic elements that implement the portion of the circuit design are enabled for shut down. In addition to the generation of the RTL design, a Power Intent File is generated to communicate a list of retention and non-retention registers to the downstream EDA flow.

20 Claims, 6 Drawing Sheets

POWER SHUT-OFF IN HIGH-LEVEL SYNTHESIS FLOW

TECHNICAL FIELD

The present disclosure generally relates to the technical field of circuit design. In particular, the present disclosure addresses systems and methods for power shut-off in high level synthesis (HLS) flow of a circuit design.

BACKGROUND

An integrated circuit (IC) layout specifies portions of various components of an IC. An IC typically includes a large number of registers, latches, flip-flops and/or other types of clocked devices. Applying power saving techniques in such IC layouts present many challenges.

BRIEF DESCRIPTION OF THE DRAWINGS

To easily identify the discussion of any particular element or act, the most significant digit or digits in a reference number refer to the figure number in which that element is first introduced.

Various ones of the appended drawings merely illustrate example embodiments of the present inventive subject matter and cannot be considered as limiting its scope.

DETAILED DESCRIPTION

Figure 1:
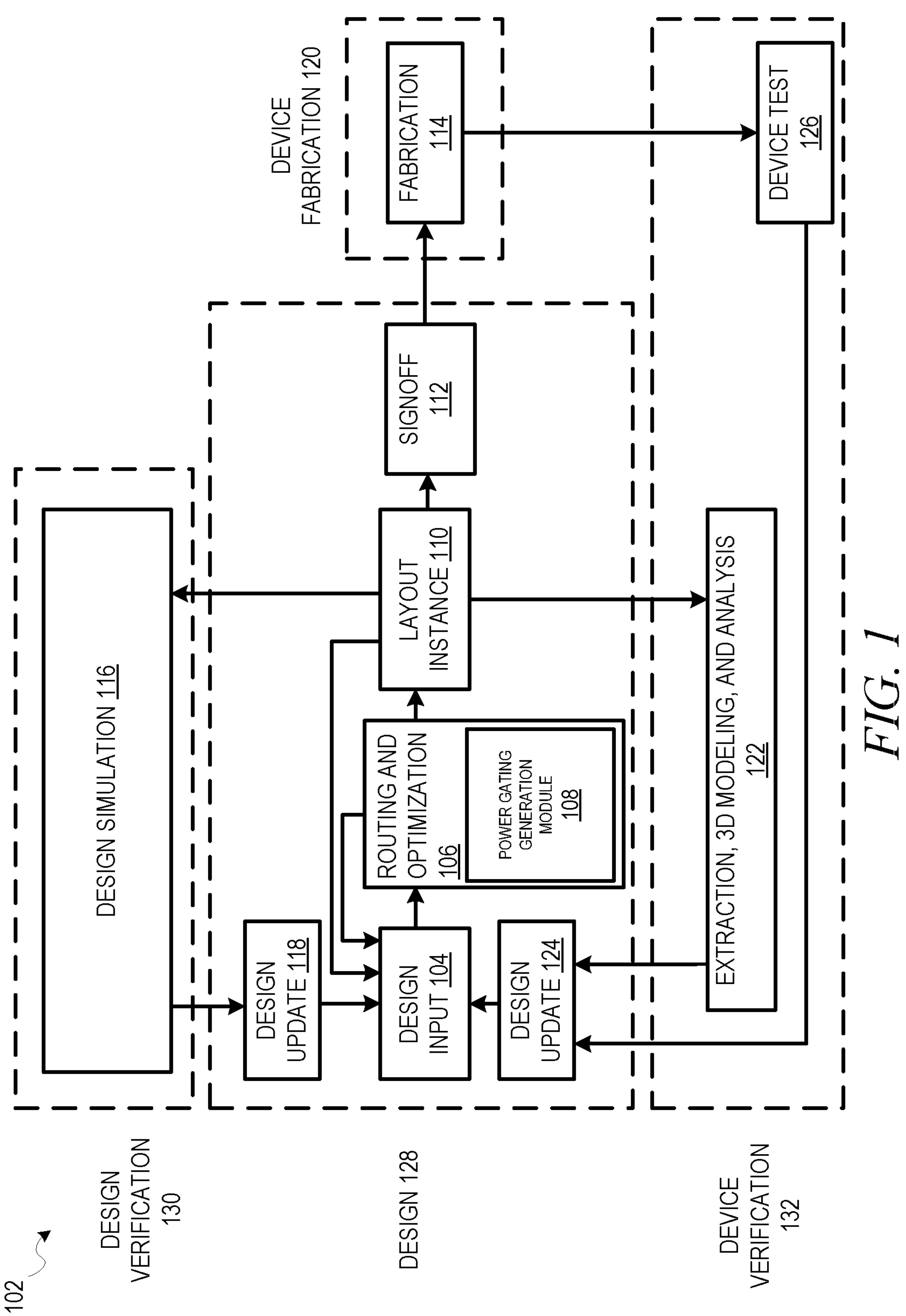
FIGS. 1 and 2 illustrate an example design process flow that includes a power shut-off generation module, in accordance with some embodiments of the present disclosure.

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

Certain IC layouts are generated by synthesizing an HLS file which then provides the register transfer level (RTL) design file. The HLS file can be a systemC or C++ file. Once the RTL design file has been created, a user separately designs a universal power format (power-intent) file to control power shut-off to various circuit portions. Power shut-off is a low power technique where parts of the design are powered off when not in use. To maintain the functionality of the design, critical registers need to be retained (e.g., saved just before the shut-off and restored when the operation is resumed). Also, the shut-down portion of the design needs to be properly isolated (e.g., some the signals driven by the shut-down portion of the design need to be forced to a known value) to maintain the operation of the rest of the design.

Power shut-off is typically employed for design modules that are only active a very small percentage of the time. The reason is that retention registers are expensive to implement from a power and design complexity perspective, and the cost they require needs to be traded off against the power gains achieved by powering down the design. Power shut-off is generally considered to be an "expert" technique in that it requires significant expertise to employ. Beginner designers typically find this technique difficult to deploy.

Typically the functionalities a designer addresses in order to enable power shut-off include defining shut-down signals and indicating the conditions where shutting down the design portion is allowed. These conditions are propagated to an output port of the module (portion) being shut down and input to a power control module. Once the power control module receives the signal indicating that the module can be shut down, the power controller proceeds to remove power from the module to save power.

The process for defining these conditions and identifying the module to shut down involve using the power-intent file. The power-intent file allows the user to manually specify which portions of the design can be power gated to save power and energy. Specifically, the user can add registers to the power-intent that need to be retained and signals to isolate during power down operations. This process involves the user finding which registers need to be retained and which do not to enable the module to be shut down and still operate in a consistent manner. In this way, when a condition, specified by the user in the power-intent file, indicates that a circuit portion can be powered down, the registers specified in the power-intent file that correspond to the circuit portion being power down are retained while other registers are discarded. Namely, the registers that need to be retained represent a state of the circuit portion that may need to remain available to be read by other circuit portions and/or that may need to be in the same state when the circuit portion is ultimately powered back up.

Analyzing a design and determining which registers need to be retained and which do not is a very time consuming and error-prone task. This is because if the designer does not retain enough registers, the design will not work when powered back up. If the designer retains too many registers, space, cost, and power are sacrificed. Some companies resort to simply retaining ALL the registers, but these retention registers are very expensive, so this strategy is very undesirable. Even for relatively simple designs, this task can take months of engineering time. To make matters worse, when a design requires modification in the future, this problem is even worse to reverse engineer.

Similarly to retention cells, isolation cells also incur area and power penalty and need to be minimized. The conservative approach is to isolate all outputs of the module being shut down. Even in this approach, the designers need to decide on the isolation value. This value is typically determined by the communication protocol between the module being shut down and the rest of the system. During shutdown of the module, the isolation value of the communication control signal needs to indicate that the module that is shut down is not ready to communicate. If these signals are properly set, it may not be necessary to isolate data outputs of the module being shut down which can improve performance.

Embodiments of the present disclosure are directed to electronic design automation (EDA) software systems that implement techniques for automatically generating control signals and logic elements to implement power shut-off of portions of a circuit design based on an HLS file of the circuit design. Particularly, rather than having the user manually generate a power-intent file by manually reviewing the RTL file, the disclosed techniques automatically generate signals to control power shut-off of a portion of the circuit design from the (e.g., directly from) the HLS file. In this way, a user can define or designate which portions of the circuit are eligible for being shut down and, in some cases, the conditions under which the portions of the circuit can be shut down in the HLS file. The disclosed techniques can then process the HLS file to define one or more logic elements to implement the shut-down functionality of the designated portions. In some cases, the disclosed techniques automatically generate the power-intent file (e.g., a UPF file) and the RTL file by synthesizing the HLS file and detecting power down indications and conditions in the HLS file. The power-intent file, together with the RTL file or design, can be processed (e.g., by EDA tools downstream in the flow from the HLS tool) to generate the gate level description of the circuit which takes into account the power down functionality described in the HLS file. This improves the overall process for generating circuit designs and reduces complexities and errors encountered in the design process.

For example, the disclosed techniques access a HLS flow file representing a circuit design. The disclosed techniques process the HLS file to identify a portion of the circuit design that is associated with power shut-off indicating that the portion of the circuit design is enabled for shut down. The disclosed techniques, based on identifying the portion of the circuit design that is associated with power shut-off, synthesize the HLS file into a RTL design of the circuit design in which one or more logic elements that implement the portion of the circuit design are enabled for shut down.

In some examples, the RTL design reflects scheduling and resource allocation corresponding to the circuit design represented by the HLS file. In some examples, the processing of the HLS file includes detecting a shut-down enabled signal in the HLS file. The disclosed techniques identify the portion of the circuit design that is controlled by the shut-down enabled signal.

In some examples, the disclosed techniques determine, in the HLS file, a condition indicating when the shut-down enabled signal is asserted to shut down the portion of the circuit design. In some examples, the portion of the circuit design corresponds a non-pipelined design. In such cases, the disclosed techniques read a value of the shut-down enabled signal while the non-pipelined design is operated to selectively shut-down the non-pipelined design. In some examples, the portion of the circuit design corresponds to a pipelined design. In such cases, the disclosed techniques determine whether the pipeline has been completely flushed. The disclosed techniques selectively shut down the pipelined design based on determining whether the pipeline has been completely flushed.

In some examples, the disclosed techniques generate a control and data flow graph (CDFG) based on the HLS file. The disclosed techniques identify the portion of the circuit design based on the CDFG. In some examples, the disclosed techniques generate, based on the HLS file, a power-intent file that specifies which parts and under which condition to power down the one or more logic elements that implement the portion of the circuit design.

In some examples, the disclosed techniques generate a list of registers of the portion of the circuit design to retain when the portion of the circuit design is powered down. In some examples, the disclosed techniques determine that an individual register in the list of registers is used to implement a part of the portion of the circuit design. The disclosed techniques select between first and second types of registers to implement the individual register for the part of the portion of the circuit design based on determining that the individual register is in the list of registers.

In some examples, the first type of register retains data during shut down using two power supplies and the second type of register loses data during shut down. The first type of register is selected to implement the individual register in response to determining that the individual register in the list of registers is used to implement the part of the portion of the circuit design.

In some examples, the disclosed techniques determine that a second register used to implement a second part of the portion of the circuit design is excluded from the list of registers. The disclosed techniques selects the second type of register to implement the second register in the second part of the portion of the circuit design.

In some examples, the disclosed techniques generate another list of registers of the portion of the circuit design to not retain when the portion of the circuit design is powered down. In some examples, the disclosed techniques generate a list of signals of the portion of the circuit design to isolate when the portion of the circuit design is powered down.

In some examples, the disclosed techniques present the power-intent file to a user. The disclosed techniques receive input from the user modifying which parts and under which condition to power down the one or more logic elements that implement the portion of the circuit design. In some examples, the disclosed techniques perform at least one of power estimation, logic synthesis or power simulation operations using the RTL design and the power-intent file.

In some examples, the disclosed techniques validate safety of powering up and power down the portion of the circuit design based on the RTL design and the power-intent file. In some examples, the disclosed techniques attach a condition representing when the one or more logic elements that implement the portion of the circuit design are enabled for shut down to an output port for communication with an external power controller and provide the RTL design to the external power controller.

Reference will now be made in detail to specific example embodiments for carrying out the disclosed subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

The various operations of example methods described herein may be performed, at least partially, by one or more processors that are temporarily configured (e.g., by software) or permanently configured to perform the relevant operations. Similarly, the methods described herein may be at least partially processor-implemented. For example, at least some of the operations of a method may be performed by one or more processors. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an API). The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

FIG. 1 is a diagram illustrating an example design process flow 102 of an EDA software system that includes a power shut-off generation module 108 in accordance with some embodiments. As shown in FIG. 1, the design process flow 102 includes a design phase 128, a device fabrication phase 120, a design verification phase 130, and a device verification phase 132. The design phase 128 involves an initial design input operation 104 where basic elements and functionality of a device, typically an IC, are determined. The initial design input operation 104 may also include revisions to elements or functionality of the device based on various analyses and optimization of a circuit design to be include in the device. This initial design input operation 104 operation is where block instances are used in the circuit design and any additional circuitry for the circuit design around the blocks is selected. The initial strategy, tactics, and context for the device to be created are also generated in the initial design input operation 104, depending on the particular design algorithm being used. In some cases, the initial design input operation 104 includes the generation of the HLS file, such as using a SystemC and/or C++ programming language (e.g., a software programming language).

In some embodiments, following an initial selection of design values in the design input operation 104, routing, timing analysis, and optimization are performed in a routing and optimization operation 106, along with any other automated design processes. Specifically, the HLS file is synthesized into an RTL design in which the hardware description corresponding to the software programming language is generated, such as in Verilog. In this phase, a resource allocation corresponding to the circuit design represented by the HLS file is scheduled. The RTL design can be generated by generating a control and data flow graph (CDFG) based on the HLS file and using the CDFG to select which hardware logic elements are used to implement the functions described in the HLS file. While the design process flow 102 shows the routing and optimization operation 106 occurring prior to a layout instance operation 110, routing, timing analysis, and optimization in operation 106 may be performed at any time to verify operation of a circuit design. For instance, in various embodiments, timing analysis in a circuit design may be performed prior to routing of connections in the circuit design, after routing, during RTL operations, or as part of a signoff operation 112, as will be understood by those skilled in the art.

In FIG. 1, the routing and optimization operation 106 includes a power shut-off generation module 108, which may be used in accordance with various embodiments described herein to synthesize the HLS file. The power shut-off generation module 108 accesses the HLS file representing a circuit design. The power shut-off generation module 108 processes the HLS file to identify a portion of the circuit design that is associated with power shut-off indicating that the portion of the circuit design is enabled for shut down. The power shut-off generation module 108, based on identifying the portion of the circuit design that is associated with power shut-off, synthesizes the HLS file into the RTL design of the circuit design in which one or more logic elements that implement the portion of the circuit design are enabled for shut down. The power shut-off generation module 108 can be included in any other component illustrated in FIG. 1 in the alternative or additionally.

In FIG. 1, after design inputs are used in the design input operation 104 to generate an RTL implementation, the RTL is transformed into a gate level implementation by a logic synthesis tool and passed to 106 where the routing and optimization operation 106 is performed, a layout is generated in the layout instance operation 110. The layout describes the physical layout dimensions of the device that match the design inputs. Prior to this layout being provided to a fabrication operation 114, the signoff operation 112 is performed on the circuit design defined by the layout.

After signoff verification by the signoff operation 112, a verified version of the layout is used in the fabrication operation 114 to generate a device, or additional testing and design updates may be performed using designer inputs or automated updates based on design simulation operations 116, or extraction, 3D modeling, and analysis operations 122. Once the device is generated, the device can be tested as part of device test operation 126, and layout modifications generated based on actual device performance.

A design update operation 118 from the design simulation operation 116, a design update operation 124 from the device test operation 126 or the extraction, 3D modeling, and analysis operations 122, or the design input operation 104 may occur after the initial layout instance operation 110 is performed. In various embodiments, whenever design inputs are used to update or change an aspect of a circuit design, a timing analysis and the routing and optimization operation 106 may be performed.

Figure 2:
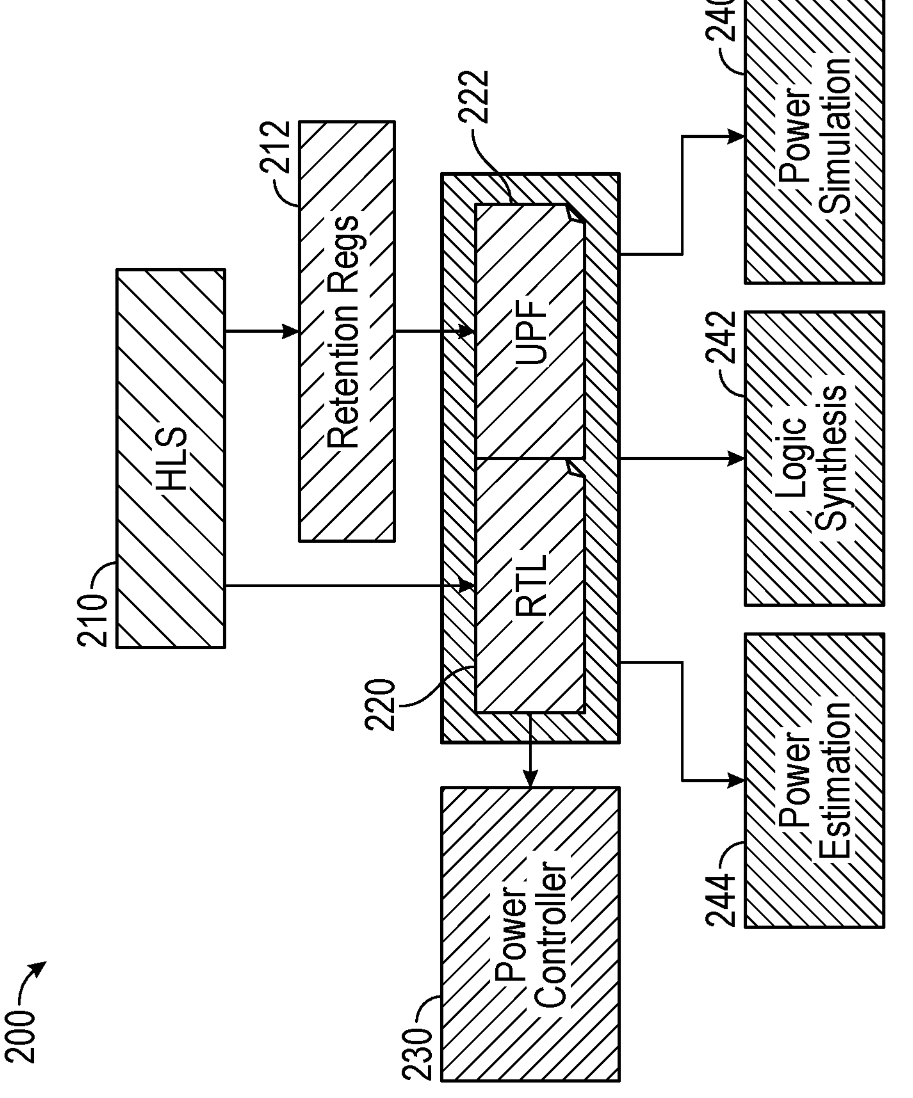

FIG. 2 illustrates an example design process flow 200 that includes the power shut-off generation module 108 of FIG. 1. The design process flow 200 includes the receipt, access, and/or generation of an HLS file 210. This HLS file 210 can be created by a user using a general software programming language that includes libraries for hardware description of a circuit design. The HLS file 210 is processed by the power shut-off generation module 108 to detect or determine which portions of the circuit design in the HLS file 210 are enabled for power shut-off or enabled to be shut down (e.g., temporarily) during operation of the circuit corresponding to the circuit design.

For example, the power shut-off generation module 108 can detect a portion of the HLS file 210 that includes a shut-down enabled signal. The shut-down enabled signal identifies which parts of the code in the HLS file 210 can be shut down and under which conditions. Using the shut-down enabled signal, the power shut-off generation module 108 determines in the HLS file 210 a condition indicating when the shut-down enabled signal is asserted to shut down the portion of the circuit design. In some cases, the portion of the circuit design described in the HLS file 210 corresponds to a non-pipelined design portion. In this case, a for loop or while loop can be described and coded which continuously keeps a portion of the circuit design shut down while the shut-down enabled signal is asserted. In such circumstances, the power shut-off generation module 108 continuously or periodically reads a value of the shut-down enabled signal (or some other signal referenced or associated with the shut-down enabled signal) while the non-pipelined design is operated to selectively shut-down the non-pipelined design. When the shut-down enabled signal is no longer asserted, the power shut-off generation module 108 wakes up or powers up or on the corresponding design portion.

In some examples, the power shut-off generation module 108 can determine that the portion of the circuit design associated with the shut-down enabled signal corresponds to a pipelined design. In such cases, the power shut-off generation module 108 accesses a pipeline of information that is utilized by a subset of logic elements or subset of code. The power shut-off generation module 108 can continue accessing or reading the pipeline to determine when the pipeline is completely flushed or empty. The power shut-off generation module 108 selectively shuts down the pipelined design based on determining whether the pipelined design has been completely flushed. For example, the power shut-off generation module 108 can keep the circuit design with the pipeline design power up until the pipeline is flushed. At this point, the power shut-off generation module 108 powers down the portion of the circuit design until a threshold period of time is reached, another condition is satisfied, and/or a signal with inputs to the pipeline design is received. Then, the power shut-off generation module 108 power on the pipeline design. In this way, the power shut-off generation module 108 infers the need to shut down the portion of the circuit design without having to receive explicit instructions from a user or reading continuously a shut-down enabled signal.

Figure 3:
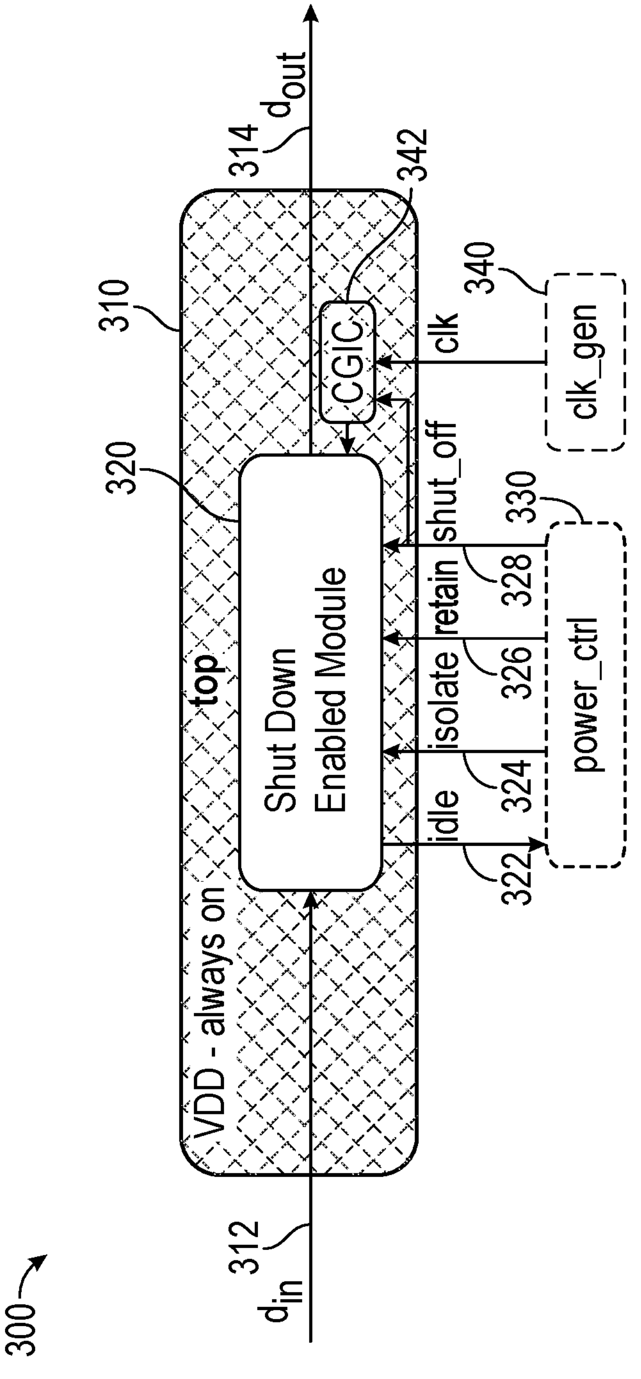
FIG. 3 illustrates an example of an HLS description of a module enabled for shut-down, in accordance with some embodiments of the present disclosure.

For example, FIG. 3 illustrates an example of an HLS description 300 of a module enabled for shut-down. Specifically, the HLS description 300 includes a top level module 310 that defines code for a plurality of modules of the circuit design. The HLS description 300 can be the project configuration file. Among the plurality of modules, the HLS description 300 defines an individual module 320 that is enabled to be shut-down. The individual module 320 is described as receiving an input signal 312 and generating an output signal 314. Based on the input signal 312 and the output signal 314, the individual module 320 selectively triggers a shut-down enabled signal. An external or internal clock generation module 340 provides a clock signal to the top level module 310 and to the individual module 320. The clock signal can be processed by a clock control module 342 (CGIC), such as to change the clock frequency or divide the clock frequency that is provided to the individual module 320. In some cases, the CFIC module 342 can also be selectively shut down, such as when the individual module 320 is shut down.

In some cases, the individual module 320 outputs an idle signal 322, such as to an external or internal power control module 330. The power control module 330 can be part of the individual module 320. The external or internal power control module 330 can process the idle signal 322 to selectively power down the individual module 320. For example, when the idle signal 322 indicates that the individual module 320 is idle and not performing any operations, the external or internal power control module 330 accesses a list of registers to retain 326 and list of registers that are not to be retained which are used to implement the individual module 320. The external or internal power control module 330 can also access a list of signals to isolate 324 which are associated with the individual module 320.

The external or internal power control module 330 can then issue a shut off signal 328 to the individual module 320 and/or to the CGIC module 342.

This signal causes the individual module 320 to be powered down while retaining certain states of certain registers and isolating a subset of signals of the input signal 312 and/or other control signals.

Referring back to FIG. 2, in some examples, the power shut-off generation module 108 generates a list of retention registers 212 which can include registers that are used to implement the portion of the circuit design that is enabled for shut down. The list of registers 212 identifies which registers need to be retained while the portion of the circuit design is shut down and/or which registers are don't care and do not need to be retained. Using the list of retention registers 212, the power shut-off generation module 108 generates the RTL design file 220 and a power-intent file 222. In some cases, the power shut-off generation module 108 implements registers on the list of retention registers 212 that need to be retained using a first type of register (e.g., a first type of logic storage element) and implements registers on the list of retention registers 212 that do not need to be retained using a second type of register (e.g., a second type of logic storage element).

Figure 4:
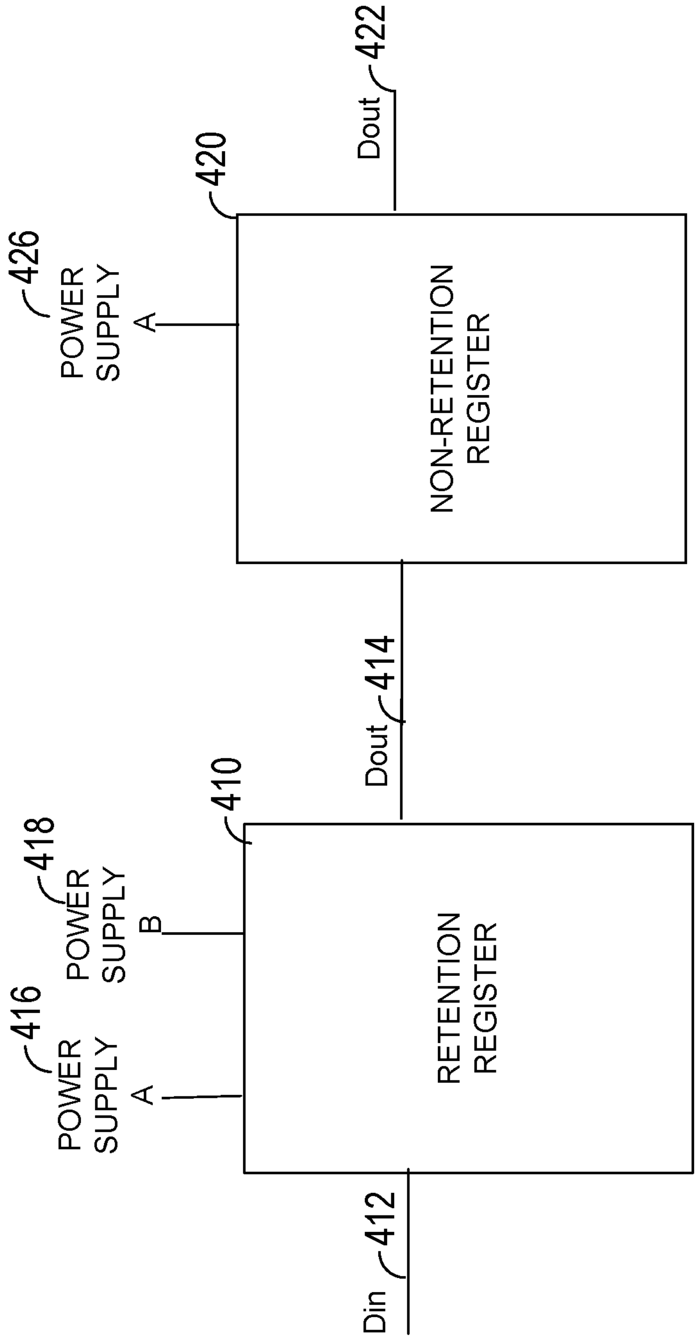
FIG. 4 illustrates an example of different registers that can be used to implement a module that is enabled for shut down, in accordance with some embodiments of the present disclosure.

For example, FIG. 4 illustrates an example of different registers or register types 400 that can be used to implement a module that is enabled for shut down, in accordance with some embodiments of the present disclosure. The register types include a first type of register or storage element 410 which can be used to implement registers that retain their states or values while a corresponding design portion is shut down. The register types include a second type of register or storage element 420 which can be used to implement registers that do not retain their states or values while a corresponding design portion is shut down. The register or storage element 410 can include an input signal 412 that is registered or stored synchronously or asynchronously and output as a signal 414. The register or storage element 410 can include two power supplies, a first power supply 416 and a second power supply 418. The first power supply 416 can correspond to a power supply that is removed when the module enabled for shut down is shut down where the second power supply 418 is retained and continues providing power to the 410 while the module is shut down. In some cases, the second power supply 418 can be of a lower power value than the first power supply 416.

The register or storage element 420 receives an input signal, such as signal 414 from register or storage element 410 or another logic element of the module being shut down. The register or storage element 420 receives a power supply input 426, such as from the same power source as the first power supply 416. The register or storage element 420, while power on, provides a registered output 422 synchronously or asynchronously corresponding to the input signal received by the register or storage element 420. When the module is shut down, the power supply input 426 is powered off or disconnected and the state of the output 422 is don't care or a floating value. In this way, all of the information stored by the register or storage element 420 is lost during power down of the module being shut down.

Referring back to FIG. 2, the power shut-off generation module 108 provides the RTL design file 220 and/or the power-intent file 222 to a power controller 230. The power controller 230 provides power to various elements of the circuit including the first power supply 416 and the second power supply 418. The power controller 230 selectively powers down certain modules or circuit elements of the circuit design when power down conditions are met that are described in the RTL design file 220 based on the HLS file 210. In some cases, the power-intent file 222 is presented to an end user or designer to allow the end user or designer to modify and/or review the conditions and list of registers being retained and signals being isolated.

The RTL design file 220 and/or the power-intent file 222 can be provided to a power estimation module 244 which processes the files to estimate the amount of power consumed and/or saved by the overall circuit design and/or portions of the design. Similarly, the RTL design file 220 and/or the power-intent file 222 can be provided to a logic synthesis module 242 which processes the files to generate the list of logic elements needed to implement the design and verify that the proper operation of the modules. The RTL design file 220 and/or the power-intent file 222 can be provided to a power simulation module 240 which processes the files to simulate the power in the overall circuit design and/or portions of the design, such as to validate safety of powering up and power down the portion of the circuit design.

Figure 5:
FIG. 5 illustrates an example process for generating power shut-off from an HLS file, in accordance with some embodiments of the present disclosure.
Figure 5:
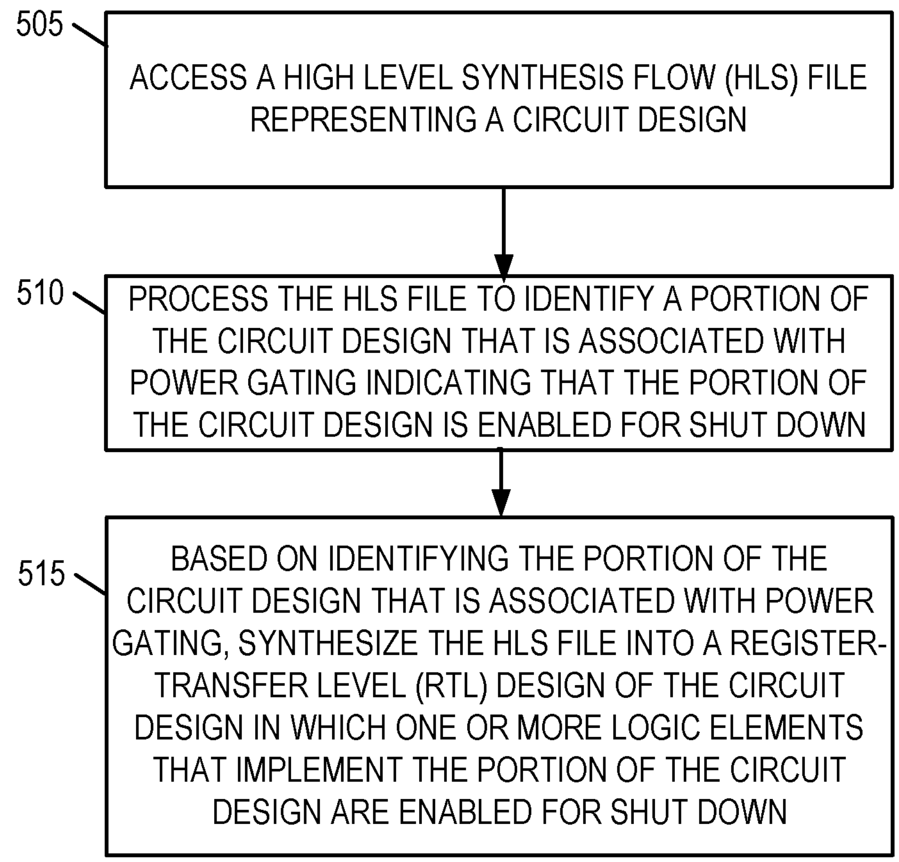

FIG. 5 illustrates a process 500 for performing combinational loop emulation, according to some embodiments of the present disclosure. The process 500 begins with operation 505 in which an HLS file representing a circuit design is accessed. At operation 510, the HLS file is processed to identify a portion of the circuit design that is associated with power shut-off indicating that the portion of the circuit design is enabled for shut down, and, at operation 515, based on identifying the portion of the circuit design that is associated with power shut-off, the HLS file is synthesizing into a RTL design or file of the circuit design in which one or more logic elements that implement the portion of the circuit design are enabled for shut down.

Figure 6:
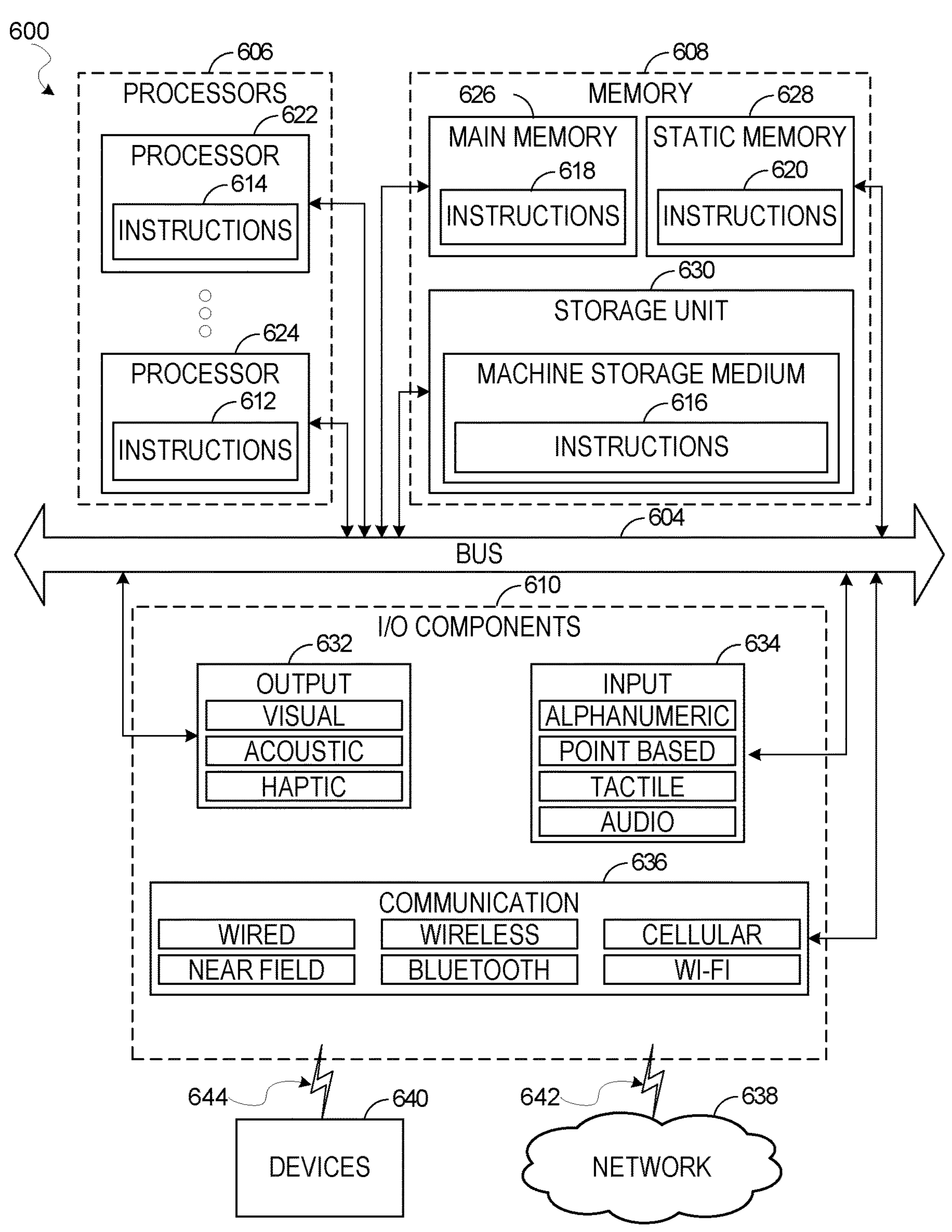
FIG. 6 is a functional block diagram of an example computing system for carrying out methods and operations described herein, in accordance with some embodiments of the present disclosure.

FIG. 6 is a functional block diagram of a computing system 600 for executing process 500 and other processes described above, along with other embodiments of the present disclosure. The computing system 600 may execute an EDA software system and for performing the process 500, and other processes described above, in accordance with some embodiments of the present disclosure. A machine is shown in the form of a computing system 600 within which a set of instructions may be executed for causing the machine to perform any one or more of the process 500 and other methodologies discussed herein, according to some embodiments. Specifically, FIG. 6 shows a diagrammatic representation of the machine in the example form of a computing system 600. The computing system 600 may include a bus 604, processors 606, memory 608, and I/O components 610, which may be configured to communicate with each other such as via the bus 604. The machine may include instructions 612-620 (e.g., software, a program, an application, an applet, an app, or other executable code) for causing the machine to perform any one or more of the methodologies discussed herein may be executed. For example, the instructions 612-620 may cause the machine to execute an EDA software system that executes the above processes described in the above description. The instructions 612-620 transform the general, non-programmed machine into a particular machine programmed to carry out the described and illustrated functions in the manner described here. In alternative embodiments, the machine operates as a standalone device or may be coupled (e.g., networked) to other machines. In a networked deployment, the machine may operate in the capacity of a server machine or a client machine in a server-client network environment, or as a peer machine in a peer-to-peer (or distributed) network environment. The machine may comprise, but not be limited to, a server computer, a client computer, a personal computer (PC), a tablet computer, a laptop computer, a netbook, a smart phone, a mobile device, a), a network router, a network switch, a network bridge, or any machine capable of executing the instructions 612-620, sequentially or otherwise, that specify actions to be taken by the machine. Further, while only a single machine is illustrated, the term "machine" shall also be taken to include a collection of machines that individually or jointly execute the instructions 612-620 to perform any one or more of the methodologies discussed herein.

In an example embodiment, the processors 606 (e.g., a central processing unit (CPU), a reduced instruction set computing (RISC) processor, a complex instruction set computing (CISC) processor, a graphics processing unit (GPU), a digital signal processor (DSP), an application-specific integrated circuit (ASIC), a radio-frequency integrated circuit (RFIC), another processor, or any suitable combination thereof) may include, for example, a processor 622 and a processor 624 that may execute the instructions 614, 612. The term "processor" is intended to include multi-core processors 606 that may comprise two or more independent processors (sometimes referred to as "cores") that may execute instructions contemporaneously. Although FIG. 6 shows multiple processors 606, the machine may include a single processor with a single core, a single processor with multiple cores (e.g., a multi-core processor), multiple processors with a single core, multiple processors with multiple cores, or any combination thereof.

The memory 608 may include a main memory 626, a static memory 628, and a storage unit 630, both accessible to the processors 606 such as via the bus 604. The main memory 626, the static memory 628, and the storage unit 630 store the instructions 616-620 embodying any one or more of the processes, methodologies or functions described herein. The instructions 612-620 may also reside, completely or partially, within the main memory 626, within the static memory 628, within the storage unit 630, within at least one of the processors 606 (e.g., within the processor's cache memory), or any suitable combination thereof, during execution thereof by the machine.

The I/O components 610 may include a wide variety of components to receive input, provide output, produce output, transmit information, exchange information, capture measurements, and so on. The specific I/O components 610 that are included in a particular machine will depend on the type of machine. For example, portable machines such as mobile phones will likely include a touch input device or other such input mechanisms, while a headless server machine will likely not include such a touch input device. It will be appreciated that the I/O components 610 may include many other components that are not shown in FIG. 6. The I/O components 610 are grouped according to functionality merely for simplifying the following discussion and the grouping is in no way limiting. In various example embodiments, the I/O components 610 may include output components 632 and input components 634. The output components 632 may include visual components (e.g., a display such as a plasma display panel (PDP), a light emitting diode (LED) display, a liquid crystal display (LCD), a projector, or a cathode ray tube (CRT)), acoustic components (e.g., speakers), other signal generators, and so forth. The input components 634 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), and the like.

Communication may be implemented using a wide variety of technologies. The I/O components 610 may include communication components 636 operable to couple the machine to a network 638 or devices 640 via a coupling 642 and a coupling 644, respectively. For example, the communication components 636 may include a network interface component or another suitable device to interface with the network 638. In further examples, the communication components 636 may include wired communication components, wireless communication components, cellular communication components, and other communication components to provide communication via other modalities. The devices 640 may be another machine or any of a wide variety of peripheral devices (e.g., a peripheral device coupled via a universal serial bus (USB)).

Executable Instructions and Machine Storage Medium

The various memories (e.g., 608, 626, 628 and/or memory of the processor(s) 606, 622, 624) and/or the storage unit 630 may store one or more sets of instructions and data structures (e.g., software) embodying or utilized by any one or more of the methodologies or functions described herein. These instructions, when executed by the processor(s) 606, cause various operations to implement the disclosed embodiments.

As used herein, the terms "machine-storage medium," "device-storage medium," and "non-transitory computer-storage medium" mean the same thing and may be used interchangeably in this disclosure. The terms refer to a single or multiple storage devices and/or media (e.g., a centralized or distributed database, and/or associated caches and servers) that store executable instructions and/or data. The terms shall accordingly be taken to include, but not be limited to, solid-state memories, and optical and magnetic media, including memory internal or external to processors. Specific examples of machine-storage media, computer-storage media, and/or device-storage media include non-volatile memory, including by way of example semiconductor memory devices, e.g., erasable programmable read-only memory (EPROM), electrically erasable programmable read-only memory (EEPROM), field-programmable gate arrays (FPGAs), and flash memory devices; magnetic disks such as internal hard disks and removable disks; magneto-optical disks; and CD-ROM and DVD-ROM disks. The terms "machine-storage media," "computer-storage media," and "device-storage media" specifically exclude carrier waves, modulated data signals, and other such media, at least some of which are covered under the term "signal medium" discussed below.

Transmission Medium

In various example embodiments, one or more portions of the network 638 may be an ad hoc network, an intranet, an extranet, a virtual private network (VPN), a local-area network (LAN), a wireless LAN (WLAN), a wide-area network (WAN), a wireless WAN (WWAN), a metropolitan-area network (MAN), the Internet, a portion of the Internet, a portion of the public switched telephone network (PSTN), a plain old telephone service (POTS) network, a cellular telephone network, a wireless network, a Wi-Fi® network, another type of network, or a combination of two or more such networks. For example, the network 638 or a portion of the network 638 may include a wireless or cellular network, and the coupling 642 may be a Code Division Multiple Access (CDMA) connection, a Global System for Mobile communications (GSM) connection, or another type of cellular or wireless coupling. In this example, the coupling 642 may implement any of a variety of types of data transfer technology, such as Single Carrier Radio Transmission Technology (1×RTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High-Speed Packet Access (HSPA), Worldwide Interoperability for Microwave Access (WiMAX), Long Term Evolution (LTE) standard, others defined by various standard-setting organizations, other long-range protocols, or other data transfer technology.

The instructions 612-620 may be transmitted or received over the network 638 using a transmission medium via a network interface device (e.g., a network interface component included in the communication components 636) and utilizing any one of a number of well-known transfer protocols (e.g., hypertext transfer protocol (HTTP)). Similarly, the instructions 612-620 may be transmitted or received using a transmission medium via the coupling 644 (e.g., a peer-to-peer coupling) to the devices 640. The terms "transmission medium" and "signal medium" mean the same thing and may be used interchangeably in this disclosure. The terms "transmission medium" and "signal medium" shall be taken to include any intangible medium that is capable of storing, encoding, or carrying the instructions 612-620 for execution by the machine, and include digital or analog communications signals or other intangible media to facilitate communication of such software. Hence, the terms "transmission medium" and "signal medium" shall be taken to include any form of modulated data signal, carrier wave, and so forth. The term "modulated data signal" means a signal that has one or more of its characteristics set or changed in such a manner as to encode information in the signal.

Computer-Readable Medium

The terms "machine-readable medium," "computer-readable medium," and "device-readable medium" mean the same thing and may be used interchangeably in this disclosure. The terms are defined to include both machine-storage media and transmission media. Thus, the terms include both storage devices/media (non-transitory computer readable media or medium) and carrier waves/modulated data signals.

The various operations of example methods described herein may be performed, at least partially, by one or more processors that are temporarily configured (e.g., by software) or permanently configured to perform the relevant operations. Similarly, the methods described herein may be at least partially processor implemented. For example, at least some of the operations of a method may be performed by one or more processors. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

Although the embodiments of the present disclosure have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art, upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, or process that includes elements in addition to those listed after such a term in a claim is still deemed to fall within the scope of that claim.

What is claimed is:

1. A method comprising:

accessing a high level synthesis flow (HLS) file representing a circuit design;

processing the HLS file to identify a portion of the circuit design that is associated with power shut-off indicating that the portion of the circuit design is enabled for shut down; and based on identifying the portion of the circuit design that is associated with power shut-off, synthesizing the HLS file into a register-transfer level (RTL) design of the circuit design in which one or more logic elements that implement the portion of the circuit design are enabled for shut down, the synthesizing comprising selecting a first type of register to implement a register for the portion of the circuit design to be retained when the portion of the circuit design is powered down, the first type of register retaining data during shut down and a second type of register losing data during shut down.

2. The method of claim 1, comprising:

determining that the register used to implement the portion of the circuit design is to be retained when the portion of the circuit design is powered down.

3. The method of claim 1, comprising:

determining that a first register used to implement the portion of the circuit design is to be retained when the portion of the circuit design is powered down;

selecting the first type of register to implement the first register;

determining that a second register used to implement the portion of the circuit design is not to be retained when the portion of the circuit design is powered down; and selecting the second type of register to implement the second register.

4. The method of claim 1, comprising:

determining in the HLS file a condition indicating when a shut-down enabled signal is asserted to shut down the portion of the circuit design.

5. The method of claim 4, wherein the portion of the circuit design corresponds to a non-pipelined design, comprising:

reading a value of the shut-down enabled signal while the non-pipelined design is operated to selectively shut-down the non-pipelined design.

6. The method of claim 4, wherein the portion of the circuit design corresponds a pipelined design, comprising:

determining whether the pipelined design has been completely flushed; and selectively shutting down the pipelined design based on determining whether the pipelined design has been completely flushed.

7. The method of claim 1, comprising:

generating a control and data flow graph (CDFG) based on the HLS file; and identifying the portion of the circuit design based on the CDFG.

8. The method of claim 1, comprising:

generating, based on the HLS file, a power-intent file that specifies which parts and under which condition to power down the one or more logic elements that implement the portion of the circuit design.

9. The method of claim 8, comprising:

generating a list of registers of the portion of the circuit design to retain when the portion of the circuit design is powered down.

10. The method of claim 9, comprising:

determining that an individual register in the list of registers is used to implement a part of the portion of the circuit design; and selecting between the first and second types of registers to implement the individual register for the part of the portion of the circuit design based on determining that the individual register is in the list of registers.

11. The method of claim 10, wherein the first type of register is selected to implement the individual register in response to determining that the individual register in the list of registers is used to implement the part of the portion of the circuit design.

12. The method of claim 11, comprising:

determining that a second register used to implement a second part of the portion of the circuit design is excluded from the list of registers; and selecting the second type of register to implement the second register in the second part of the portion of the circuit design.

13. The method of claim 9, comprising:

generating another list of registers of the portion of the circuit design to not retain when the portion of the circuit design is powered down.

14. The method of claim 8, comprising:
generating a list of signals of the portion of the circuit design to isolate when the portion of the circuit design is powered down.

15. The method of claim 8, comprising:
presenting the power-intent file to a user; and
receiving input from the user modifying which parts and under which condition to power down the one or more logic elements that implement the portion of the circuit design.

16. The method of claim 8, comprising:
performing at least one of power estimation, logic synthesis or power simulation operations using the RTL design and the power-intent file.

17. The method of claim 8, comprising:
validating safety of powering up and power down the portion of the circuit design based on at least one of the RTL design or the power-intent file.

18. The method of claim 1, comprising:
generating a list of registers of the portion of the circuit design to not retain when the portion of the circuit design is powered down;
attaching a condition representing when the one or more logic elements that implement the portion of the circuit design are enabled for shut down to an output port for communication with an external power controller; and
providing the RTL design to the external power controller.

19. A non-transitory computer-readable medium comprising instructions, that when executed by a processor, configure the processor to perform operations comprising:
accessing a high level synthesis flow (HLS) file representing a circuit design;
processing the HLS file to identify a portion of the circuit design that is associated with power shut-off indicating that the portion of the circuit design is enabled for shut down; and
based on identifying the portion of the circuit design that is associated with power shut-off, synthesizing the HLS file into a register-transfer level (RTL) design of the circuit design in which one or more logic elements that implement the portion of the circuit design are enabled for shut down, the synthesizing comprising selecting a first type of register to implement a register for the portion of the circuit design to be retained when the portion of the circuit design is powered down, the first type of register retaining data during shut down and a second type of register losing data during shut down.

20. A system comprising:
one or more processors; and
a memory storing instructions that, when executed by the one or more processors, cause the system to perform operations comprising:
accessing a high level synthesis flow (HLS) file representing a circuit design;
processing the HLS file to identify a portion of the circuit design that is associated with power shut-off indicating that the portion of the circuit design is enabled for shut down; and
based on identifying the portion of the circuit design that is associated with power shut-off, synthesizing the HLS file into a register-transfer level (RTL) design of the circuit design in which one or more logic elements that implement the portion of the circuit design are enabled for shut down, the synthesizing comprising selecting a first type of register to implement a register for the portion of the circuit design to be retained when the portion of the circuit design is powered down, the first type of register retaining data during shut down and a second type of register losing data during shut down.

* * * * *